United States Patent [19]

Salt, Jr.

[11] 4,344,383

[45] Aug. 17, 1982

[54] RETAINER RING FOR SECURING SUBSTRATES IN A VACUUM DEPOSITION SYSTEM

[75] Inventor: Walter W. Salt, Jr., Hightstown, N.J.

[73] Assignee: RCA Corporation, New York, N.Y.

[21] Appl. No.: 215,004

[22] Filed: Dec. 10, 1980

[51] Int. Cl.³ .............................................. B05C 13/02
[52] U.S. Cl. .................................... 118/730; 118/503; 292/299
[58] Field of Search ............... 118/500, 503, 730, 729, 118/728, 715; 292/299, 256.6, 256.63, 256.65; 269/903, 287, 217; 211/41

[56] References Cited

U.S. PATENT DOCUMENTS 1,207,937 12/1916 Kruse ................................ 292/256.6
3,138,173 6/1964 Hartman .......................... 292/256.6
3,768,440 10/1973 Doman et al. ..................... 118/503
3,850,138 11/1974 Patono ............................... 118/730

FOREIGN PATENT DOCUMENTS 594265 of 1925 France .......................... 292/256.63

Primary Examiner—John D. Smith
Assistant Examiner—Bernard F. Plantz
Attorney, Agent, or Firm—Birgit E. Morris; Donald S. Cohen; Lawrence P. Benjamin

[57] ABSTRACT

A novel wafer retainer assembly is described which includes a ring member for securing wafers in a planetary fixture. The ring member is easily removed or inserted by means of thumb and forefinger pressure exerted on tabs extending from open ends of a resilient spring and maintains the wafers in apertures on the planet member without exerting any pressure on the wafers, thus avoiding breakage.

1 Claim, 4 Drawing Figures

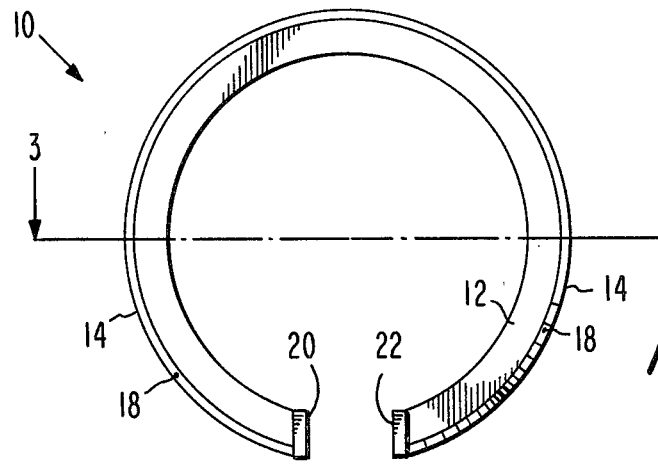
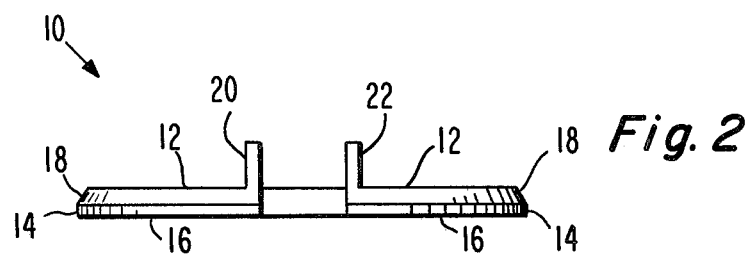
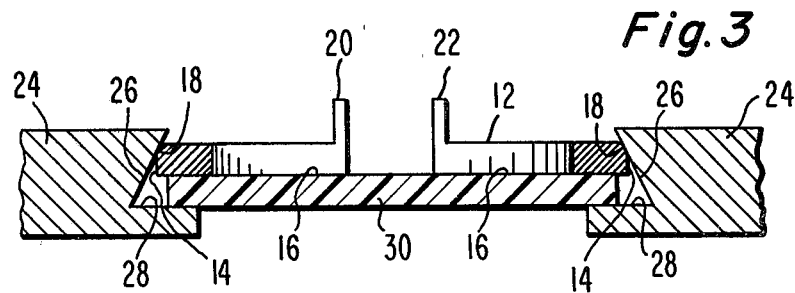
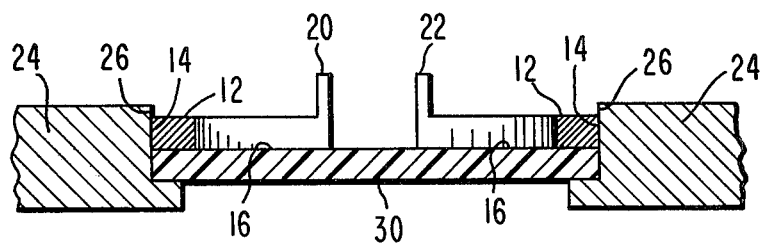

RETAINER RING FOR SECURING SUBSTRATES IN A VACUUM DEPOSITION SYSTEM

BACKGROUND OF THE INVENTION

This invention relates, in general, to vacuum deposition systems and, more particularly, to a novel means for securing a wafer or substrate to a rolling and orbiting planet in a vacuum deposition system.

The typical production deposition system used for depositing either a layer of a single element or a combination of elements on a substrate, usually consists of a vacuum chamber in which is contained a source of the material to be deposited and a substrate or target on which the source material is to be deposited. The system is usually under vacuum and, when the pressure within the vacuum chamber is reduced to the required level, the source material is then heated to the point of vaporization and deposition of the source material on the substrate or target occurs.

In an attempt to insure a uniform deposition of the source material where, for example, one desires to deposit a layer of aluminum on a semiconductor wafer, as many as seven or eight wafers may be mounted on a disc or planet. These wafers may range in diameter from about two inches to about four inches depending upon the requirements of the user. A plurality of planets are then mounted in rolling engagement with a pair of circular tracks in order to position the planets in a plane inclined toward the source. The source is usually located on the system axis and, traditionally, is positioned a few inches below the plane of the lower track on which the planets are rotating.

The planets are then caused to orbit about the system axis on the pair of circular tracks, while the source material is being vaporized and deposited on each of the semiconductor wafers. Thus, as each planet orbits the system axis, each wafer to be coated is caused to rotate about the axis of the planet to insure a uniform coating on each of the wafers. Systems of this sort are described in detail in U.S. patent application Ser. No. 89,858, filed Oct. 31, 1979, now U.S. Pat. No. 4,284,033, entitled "Means to Orbit and Rotate Target Wafers Supported on Planet Member" to E. H. del Rio and assigned to the same assignee as the subject application. Other systems for coating substrates are described in U.S. Pat. No. 3,643,625 to G. O. B. Mahl on Feb. 2, 1979, entitled "Thin-film Deposition Apparatus" and U.S. Pat. No. 4,010,710 to E. E. Williams on Mar. 8, 1977, entitled "Apparatus for Coating Substrates". These systems are cited as being typical of vacuum deposition devices.

Various planet configurations are utilized for holding the substrate during the deposition process and may have either a flat or dished configuration with apertures counter-bored therein to accept the wafers or substrates during the metallization process. In many instances, the wafers are retained by similarly shaped dished backing plates which contain springs or other holding devices in order to exert pressure on the individual wafers to hold them in place. Typically, the springs would be located at about the center of the wafer.

When rotating a planet in a vacuum system wheren the planet may contain as many as 20-24 wafers mounted thereon, it should now be obvious that the total force applied by the backing plate to secure each wafer can be considerable. Any misalignment of the backing plate, or any defective spring which protrudes further than the others represents a source of wafer breakage. In addition, some of the springs that remain properly aligned lose their tension after a certain period of use and become too weak to hold the wafer securely in place. These latter springs are difficult to detect due to the large total force required to secure the backing plate. It has been found that the generally accepted technique for determining if the assembled planet and associated backing plate has been properly loaded is to lift the assembly and shake it. This shaking operation will indicate which wafers are too loose and likely to fall out during the rotation and orbiting of the assembly about the system axis. Should there be any loose wafers that are likely to fall out and break, the assembly must be disassembled and the spring tension on the defective springs adjusted in order that all wafers be retained in its proper place. Despite these precautions, it has been found that springs lose their tension during a run, thereby allowing one or more wafers to fall out and break, thus enhancing the possibility that the system will jam. Should this occur, the deposition run will be useless and processing of the good wafers must be repeated. This results in unproductive down time for the machine and a lowered through-put.

SUMMARY OF THE INVENTION

In accordance with the teachings of my invention, a planetary fixture and an associated securing means is described wherein a wafer to be coated is positioned in an aperture in the planetary fixture and the wafer is held in the aperture by means of a securing means in the form of a resilient retainer ring which, when positioned in the aperture, maintains the wafer therein by means of pressure applied to the sides of the aperture as distinguished from the prior art method which applies pressure to the center of the wafer. An additional advantage resulting from my novel securing means is that it dispenses with the need for the backing plate and its associated springs.

BRIEF DESCRIPTION OF THE FIGURES

In the drawing:

FIG. 1 is a plan view of the retainer ring of the subject invention;

FIG. 2 is an elevation view of the retainer ring of the subject invention;

FIG. 3 is a section of the retainer ring of the subject invention taken along lines 3—3 of FIG. 1 showing the relative placement of the retainer ring and semiconductor substrate as it would be mounted in a rotatable planet; and FIG. 4 is a cross-sectional view of another embodiment of my novel retainer ring showing the relative placement of the retainer ring and semiconductor substrate as it would be mounted in a rotatable planet.

DETAILED DESCRIPTION OF THE INVENTION

While the following exegesis will describe and show my invention in terms of processing a silicon wafer, it will become obvious to those skilled in the art that other similar wafers or substrates, such as silicon-on-sapphire devices, may be utilized with my novel device. The only requirement is that the substrate be capable of fitting into the aperture formed in the planet member. Further, in each of the embodiments, similar elements will be similarly numbered.

Referring now to FIGS. 1 and 2, there is shown, in both plan and elevation views respectively, my novel wafer retainer means 10 which comprises an open-ended, resilient annular means having a top surface 12, an outer perimeter 14 and a bottom surface 16 parallel to top surface 12. The open ends of the retainer means are provided with a pair of upstanding portions 20 and 22 arranged at about a 90° angle to surfaces 12 and 16. In this embodiment, retainer means 10 is provided with a beveled surface 18 extending from top surface 12 to outer perimeter 14, the operation of which will be explained in conjunction with FIG. 3.

Referring now to FIG. 3, there is shown the cooperation of my retainer means 10 with a substrate 30 and a fragmentary portion of the planet member 24. In this embodiment, planet member 24 is provided with an aperture within which substrate 30 is rigidly maintained by retainer means 10 so that it may be properly exposed to the source material (not shown). In this embodiment, planet member 24 is provided with an aperture having outwardly tapered bearing sidewalls 26 which terminate in a supporting surface 28 on which the wafer rests. It should be noted that the aperture formed by sidewalls 26 should be sufficiently large as to accommodate the diameter of wafer 30 which will be coated. After the wafer is placed in the aperture and so that it rests on the surface 28, the operator, by merely applying some slight finger pressure to portions 20 and 22, is able to slip retainer means 10 into the aperture so that surface 16 rests on the upper surface of wafer 30. The angle defined by sidewalls 26 with respect to surface 28, complements the angle surface 18 forms with surface 16. Thus, when any compressive forces (used to insert retainer 10 in the aperture) are released from portions 20 and 22, surfaces 18 and 26 will mate and the expansion of retainer means 10 will force the retainer means down toward wafer 30 and hold it firmly in place to thereby preclude any movement of wafer 30 while planet member 24 rolls about and orbits the system axis (not shown).

Referring now to FIG. 4, there is shown another embodiment of my retainer means in which outer perimeter 14 and sidewalls 26 are perpendicular to both surfaces 28, 16 and 12. In this embodiment, there is no need for the tapered surface 26 shown in the embodiment of FIG. 3 nor is there need for the beveled surface 18 on retainer means 10 of FIGS. 1 and 2. This embodiment finds more utility in instances where retainer means 10 is compressed to a higher degree and thus, when allowed to expand in the aperture, will apply greater outward forces to aperture walls 26. In all other respects, the embodiment of FIG. 4 functions identically as that shown and described in FIG. 3.

In both embodiments the wafers may be secured in their respective apertures by using very slight pressure to compress the opening between portions 20 and 22. The retainer means is then positioned over the back surface of the substrate after which the insertion pressure is removed from portions 20 and 22 to allow retainer 10 to expand. It should be understood that in its relaxed of expanded state, the diameter of retainer means 10, as defined by the surface of perimeter 14 is significantly larger than the inside diameter of the aperture in which wafer 30 is placed. Upon releasing pressure from the retainer means, it has been found that retainer means 10 will remain in position by means of friction exerted against surface 26.

The removal of the retainer means is easily facilitated since all that is required is a slight pressure on portions 20 and 22 to decrease the diameter of the retainer means, usually with only a thumb and forefinger, and thereafter lifting it out.

Thus, I have provided a novel retainer means which applies minimal pressure on the surface of a wafer to be coated resulting in considerably less breakage than heretofore possible, yet is capable of rigidly maintaining the wafer in position during a metallizing run.

What I claim is:

1. An assembly for securing a wafer in an aperture of a planet member wherein the planet member is arranged for rolling and orbiting motion about a vacuum deposition system axis, comprising:

a circular bearing wall;
a support surface affixed to one end of the bearing wall for supporting the wafer, the bearing wall and support surface mounted in the planet member to define an outwardly tapered aperture therein, the diameter of the bearing wall at the one end thereof being larger than the diameter at the opposite end;
a substantially flat, resilient member arranged as an open-ended annulus, the annulus having an outer side wall of a given diameter greater than the diameter of the bearing wall at the one end thereof;
a beveled surface between the top surface and the outer side wall of the annulus; and
engaging means affixed to each end of the annulus for engaging and applying compressive forces to the annulus and for inserting the annulus into the aperture, whereby when the annulus is inserted in the aperture and the compressive forces released, the annulus expands to position the beveled surface thereof in parallel coplementary mating engagement with the bearing wall of the aperture and the annulus is forced in a direction toward the support surface.

* * * * *

UNITED STATES PATENT AND TRADEMARK OFFICE
CERTIFICATE OF CORRECTION

PATENT NO. : 4,344,383

DATED : August 17, 1982

INVENTOR(S) : Walter W. Salt, Jr.

It is certified that error appears in the above-identified patent and that said Letters Patent is hereby corrected as shown below:

Column 1, line 62, "wheren" should be --wherein--.

Column 4, line 8, "of" first occurrence should be -- or --.

Column 4, line 49, "coplementary" should be --complementary--.

Signed and Sealed this

Nineteenth Day of October 1982

[SEAL]

Attest:

Attesting Officer

GERALD J. MOSSINGHOFF

Commissioner of Patents and Trademarks